(12) United States Patent
Chern

(10) Patent No.: US 9,977,453 B2
(45) Date of Patent: May 22, 2018

(54) TEMPERATURE SENSING APPARATUS

(71) Applicant: SK hynix Inc., Gyeonggi-do OT (KR)

(72) Inventor: Jenn-Gang Chern, Redwood City, CA (US)

(73) Assignee: SK Hynix Inc., Gyeonggi-do (KR)

( * ) Notice: Subject to any disclaimer, the term of this patent is extended or adjusted under 35 U.S.C. 154(b) by 12 days.

(21) Appl. No.: 15/143,120

(22) Filed: Apr. 29, 2016

(65) Prior Publication Data
US 2016/0322976 A1  Nov. 3, 2016

Related U.S. Application Data

(60) Provisional application No. 62/154,601, filed on Apr. 29, 2015.

(51) Int. Cl.
| | |
|---|---|
| *H03L 7/00* | (2006.01) |
| *G05F 3/24* | (2006.01) |
| *H03B 5/12* | (2006.01) |
| *H03L 1/02* | (2006.01) |
| *H03K 3/027* | (2006.01) |
| *H03K 3/03* | (2006.01) |

(52) U.S. Cl.
CPC ........... *G05F 3/245* (2013.01); *H03B 5/1209* (2013.01); *H03K 3/027* (2013.01); *H03K 3/0322* (2013.01); *H03L 1/02* (2013.01); *H03L 1/022* (2013.01); *H03K 3/0315* (2013.01)

(58) Field of Classification Search
CPC ........ H03L 1/02; H03K 3/0322; H03K 3/027; H03B 5/1209
USPC ............................... 331/57, 185, 176, 17, 34
See application file for complete search history.

(56) References Cited

U.S. PATENT DOCUMENTS

| | | | |
|---|---|---|---|
| 8,115,559 B2 * | 2/2012 | Kim ..................... | H03K 3/0322 331/17 |
| 8,405,376 B2 | 3/2013 | Hwang et al. | |
| 2002/0018513 A1 * | 2/2002 | Curry .................... | G01K 1/028 374/178 |

* cited by examiner

*Primary Examiner* — Arnold Kinkead
(74) *Attorney, Agent, or Firm* — IP & T Group LLP

(57) ABSTRACT

An apparatus for temperature sensing may include: a bias generator suitable for generating a complementary-to-absolute-temperature (CTAT) bias voltage; a regulator suitable for regulating a bias voltage by using CTAT bias voltage and outputting a regulated bias voltage; and a ring oscillator suitable for receiving the regulated bias voltage and generating an oscillation signal based on the regulated bias voltage.

17 Claims, 13 Drawing Sheets

TEMPERATURE SENSING APPARATUS

CROSS-REFERENCE TO RELATED APPLICATIONS

This application claims the benefit of U.S. Provisional Application No. 62/154,601 filed Apr. 29, 2015, the entire contents of which are incorporated herein by reference.

BACKGROUND

1. Field

Exemplary embodiments of the present disclosure relate to a temperature sensing scheme.

2. Description of the Related Art

In many modern system-on-chip (SOC) designs, there is a need to measure the on-chip temperature for various reasons, such as reliability, metal migration, thermal runaway, and also possibly for external device protection due to elevated environmental temperatures.

SUMMARY

Embodiments of the present disclosure are directed to a temperature sensing apparatus.

Aspects of the invention include an apparatus for temperature sensing including: a bias generator suitable for generating a complementary-to-absolute-temperature (CTAT) bias voltage; a regulator suitable for regulating a bias voltage by using CTAT bias voltage and outputting a regulated bias voltage; and a ring oscillator suitable for receiving the regulated bias voltage and generating an oscillation signal based on the regulated bias voltage.

Aspects of the invention include an apparatus including: a bias generator suitable for generating a temperature complementary voltage, the bias voltage generator including: a current source having a first terminal coupled to a power supply voltage terminal and a second terminal; and a first transistor and a second transistor coupled in series between the second terminal of the current source and a ground terminal; a regulator suitable for regulating a bias voltage by using the temperature complementary voltage and outputting a regulated bias voltage; and a ring oscillator suitable for receiving the regulated bias voltage and generating an oscillation signal based on the regulated bias voltage.

Aspects of the invention include an apparatus including: a bias generator suitable for generating a complementary-to-absolute-temperature (CTAT) bias voltage; a regulator suitable for regulating a bias voltage by using the CTAT bias voltage and outputting a regulated bias voltage; and a ring oscillator suitable for receiving the regulated bias voltage and generating an oscillation signal based on the regulated bias voltage, wherein the ring oscillator includes a complementary metal oxide semiconductor (CMOS) ring oscillator having: a cascade of inverters with odd number of stages in a ring shape, suitable for receiving the regulated bias voltage and outputting an inverted bias voltage; and a frequency counter suitable for receiving the inverted bias voltage, and counting the inverted bias voltage according to a reference clock to generate the oscillation signal.

DETAILED DESCRIPTION

Figure 1:
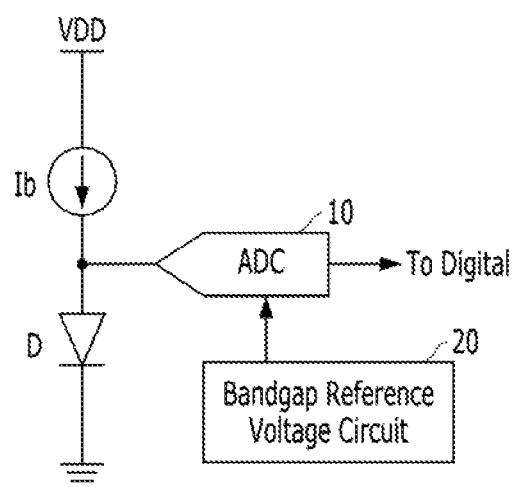
FIG. 1 is a diagram illustrating a conventional temperature sensing apparatus.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

FIG. 1 is a diagram illustrating a conventional temperature sensing apparatus.

Referring to FIG. 1, the temperature sensing apparatus includes a current source Ib, a diode D, an analog-to-digital converter (ADC) 10 and a bandgap reference voltage circuit 20. The diode D may be biased with the current source Ib, as a temperature sensor. The voltage of the diode D changes linearly with temperature (e.g., about −1 mV to −2 mV per degree Celsius increase in temperature). The bandgap reference voltage circuit 20 generates a reference voltage. The ADC 10 may digitize the voltage of the diode according to the reference voltage to output a resulting code. The resulting code can be used as the measure of the temperature.

Typically, the apparatus of FIG. 1 will include some precision reference circuits such as the bandgap reference voltage circuit 20, and a number of amplifiers and comparators, and additional local reference voltage generators, as well as high-precision capacitor or resister arrays for the ADC 10.

While the performance offered by the apparatus in FIG. 1 is adequate, the cost to implement such an apparatus may be relatively high, as it needs the diode, the bandgap reference voltage circuit and the ADC, which may include many precision amplifiers and possibly high precision capacitor array, or well-matched resistive digital-to-analog converter (DAC). As a result, the area and operating power could be high. Also, the implementation complexity and cost is relatively high.

Various embodiments are described herein that use complementary metal oxide semiconductor (CMOS) ring oscillators in a temperature sensing apparatus. This technique exploits the native temperature sensitivities associated with the CMOS transistors, and therefore it does not need a bandgap reference voltage circuit. Furthermore, the quantity to be measured is the frequency of a CMOS ring oscillator, and therefore it does not need an ADC, just a frequency counter, which can be implemented in digital domain very easily.

Figure 2:
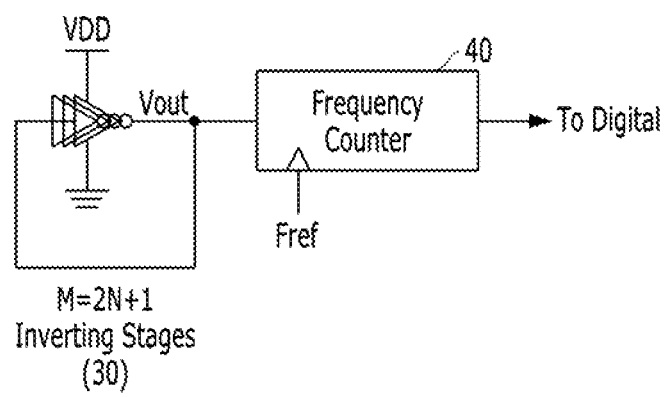
FIG. 2 is a diagram illustrating a CMOS ring oscillator as a temperature sensing apparatus.

FIG. 2 is a diagram illustrating a CMOS ring oscillator as a temperature sensing apparatus.

Referring to FIG. 2, the CMOS ring oscillator includes a cascade of inverters 30 and a frequency counter 40. The cascade of inverters 30 includes inverters with odd number of stages (e.g., M=2N+1, where N is a natural number) in a ring shape to ensure oscillation. The frequency of the ring oscillator is sensitive to both temperature and power supply voltage. When the supply voltage is fixed, the ring oscillator may be used to measure the temperature. Typically the frequency will go down with increasing temperature.

The apparatus in FIG. 2 above is sensitive to the power supply variations, and the temperature sensitivity (or gain of the temperature sensor) could be relatively low. In fact, this simple structure can fail to work a temperature sensor under certain conditions.

The potential problem of the apparatus in FIG. 2 can be understood using the inverter delay equation:

$$Td(T) \propto \frac{CL}{u(T) \cdot Cox \cdot \frac{W}{L} \cdot (Vdd - Vt(T))} = \frac{k}{u(T) \cdot (Vdd - Vt(T))} \quad (1)$$

Figure 3A:
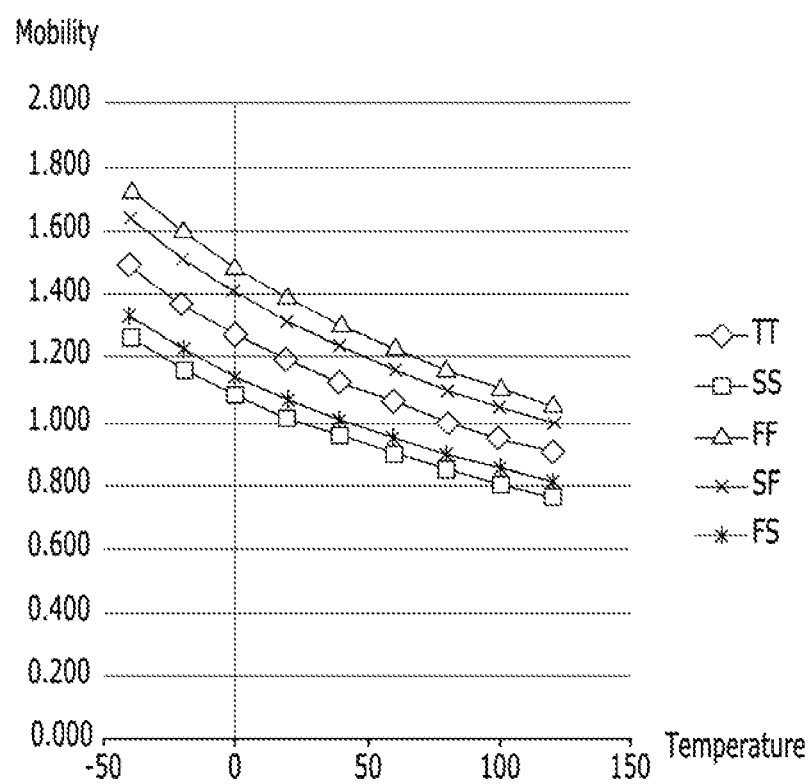
FIG. 3A illustrates a mobility versus temperature-different process corners of NMOS and PMOS.
Figure 3B:
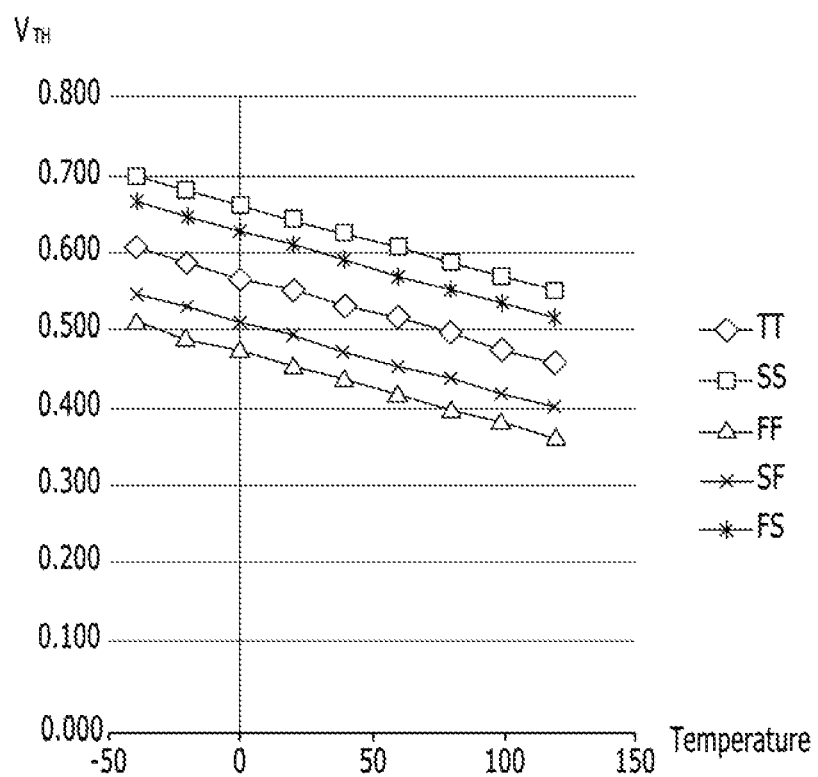
FIG. 3B illustrates a threshold voltage versus temperature-different process corners of NMOS and PMOS.

In the equation (1), CL is the load capacitance, Cox is the unit-area-capacitance of the MOS transistor, W/L is the width and length of the MOS transistor, k is a temperature-independent term, and Vdd is the supply voltage. The u(T) and Vt(T) are mobility and threshold voltage, both of which have negative temperature dependencies, as shown in FIGS. 3A and 3B. In FIGS. 3A and 3B, two letters, for example, "SF" are the process corners of NMOS and PMOS, respectively. That is, "SS" means slow NMOS and slow PMOS; "TT" means typical NMOS and typical PMOS; "FF" means fast NMOS and fast PMOS; "SF" means slow NMOS and fast PMOS; and "FS" means fast NMOS and slow PMOS.

Since both u(T) and Vt(T) have negative temperature-coefficient (tempco), the (Vdd-Vt(T)) term in the equation (1) bears a positive tempco. When Vdd>>Vt(T), the overall tempco is dominated by u(T). As a result, FIG. 2 can only work under high VDD condition. However, the semiconductor process dictates the highest VDD, which is coming down as a result of process migration. Furthermore, the Vdd variation in the equation (1) will affect the temperature sensing, therefore, it is necessary to keep Vdd constant, which implies additional regulation circuits may be needed.

Figure 4A:
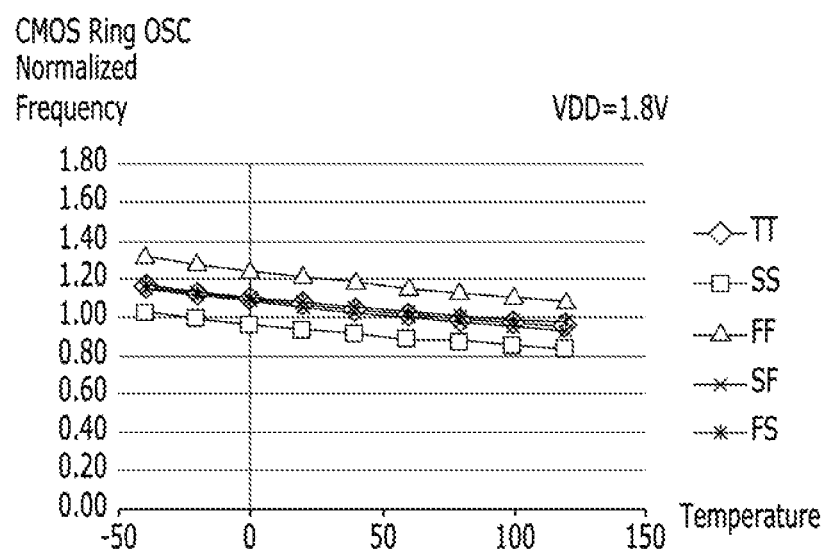
FIG. 4A illustrates an example of CMOS ring oscillator normalized frequency versus temperature.
Figure 4B:
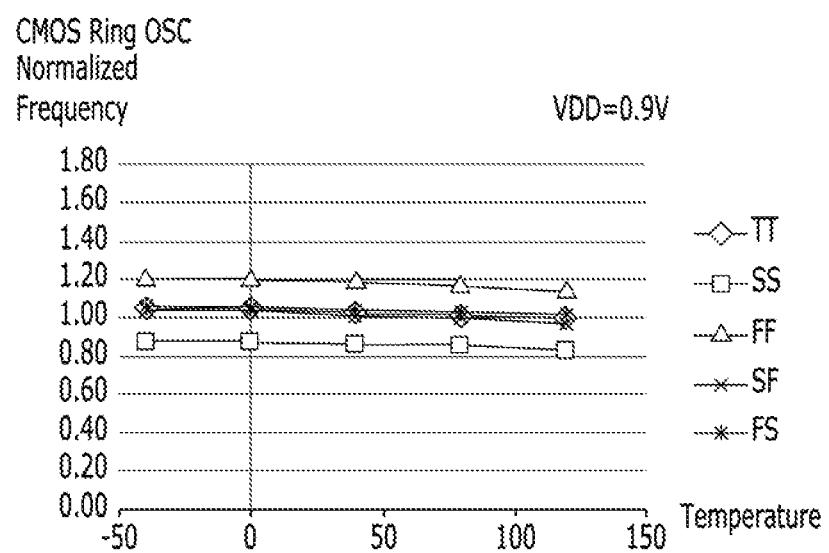
FIG. 4B illustrates another example of CMOS ring oscillator normalized frequency versus temperature.

FIGS. 4A and 4B illustrate examples of CMOS ring oscillator (OSC) normalized frequency versus temperature. FIG. 4A illustrates 1.8V CMOS ring OSC normalized-frequency versus temperature, and FIG. 4B illustrates 0.9V CMOS ring OSC normalized-frequency versus temperature.

As can be seen from FIGS. 4A and 4B, the 0.9V CMOS ring OSC has a much shallow slope, due to reduced-VDD effect, as predicted in the equation (1).

Figure 5:
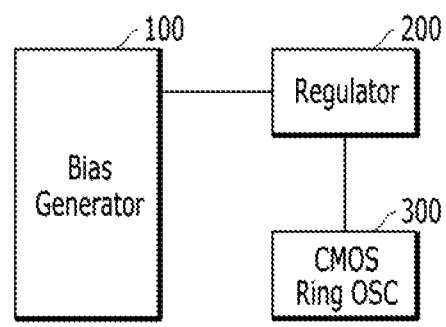
FIG. 5 is a block diagram illustrating a temperature sensing apparatus in accordance with an embodiment.

FIG. 5 is a block diagram illustrating a temperature sensing apparatus in accordance with an embodiment.

Referring to FIG. 5, the temperature sensing apparatus includes a bias generator 100, a regulator 200 and a ring oscillator 300. In some embodiments, the ring oscillator 300 may be a CMOS ring oscillator and a complementary-to-absolute-temperature (CTAT) bias may be used to address the sensitive of the CMOS ring oscillator 300 to power supply voltage variations.

The bias generator 100 may generate the CTAT bias voltage. The regulator 200 may receive the CTAT bias voltage from the bias generator 100, regulate the CTAT bias voltage to output a regulated bias voltage. The ring oscillator 300 may receive the regulated bias voltage from the regulator 200 and generate an oscillation signal based on the regulated bias voltage.

Figure 6:
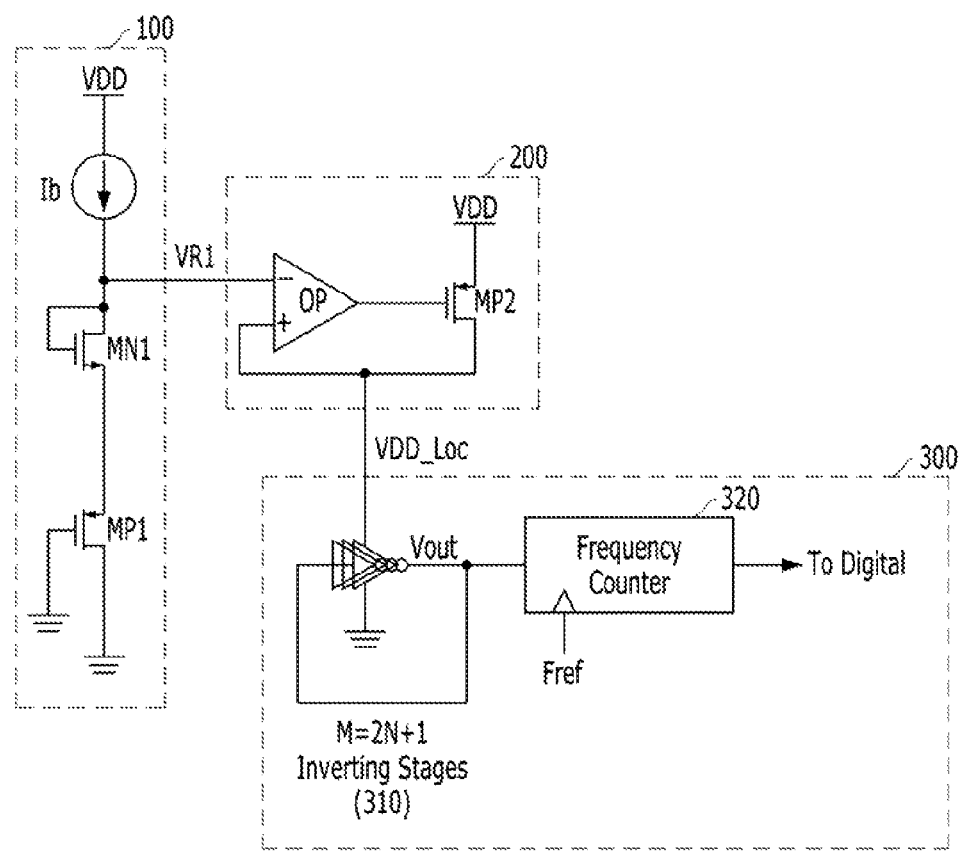
FIG. 6 is a circuit diagram illustrating a temperature sensing apparatus in accordance with an embodiment.

FIG. 6 is a circuit diagram illustrating a temperature sensing apparatus of FIG. 5 in accordance with an embodiment.

Referring to FIG. 6, the bias generator 100 may include a current source Ib, a first transistor MN1 and a second transistor MP1. The current source Ib have a first terminal coupled to a power supply voltage terminal to be provided with a power supply voltage VDD and a second terminal. The first transistor MN1 and the second transistor MP1 are coupled in series between the second terminal of the current source Ib and a ground terminal. The bias generator 100 may generate the CTAT bias voltage VR1.

The first transistor MN1 may be an N-channel metal oxide semiconductor (NMOS) transistor having a first terminal, a second terminal and a third terminal. The third terminal of the first transistor MN1 is connected to the first terminal of the first transistor MN1. The second transistor MP1 may be a P-channel metal oxide semiconductor (PMOS) transistor having a first terminal, a second terminal and a third terminal. The first terminal of the second transistor MP1 is connected to the second terminal of the NMOS transistor MN1. The second terminal and the third terminal of the second transistor MP1 are connected to the ground terminal.

The regulator 200 may include an operational amplifier OP and a third transistor MP2. The regulator 200 may receive the bias voltage VR1 from the bias generator 100, regulate the bias voltage VR1 to output a regulated constant bias voltage VDD_Loc. The operational amplifier OP includes a first input terminal (−), a second input terminal (+) and an output terminal. The first input terminal of the operational amplifier OP receives the bias voltage VR1 from the bias generator 100. The second input terminal of the operational amplifier OP outputs the regulated bias voltage VDD_Loc.

The third transistor MP2 couples between the output terminal of the operational amplifier OP and the second input terminal of the operational amplifier OP. The third transistor MP2 may be a PMOS transistor having a first terminal, a second terminal and a third terminal. The first terminal of the third transistor MP2 is connected to the power supply voltage terminal to be provided with the power supply voltage VDD. The second terminal of the third transistor MP2 is connected to the second input terminal of the operational amplifier OP. The third terminal of the third transistor MP2 is connected to the output terminal of the operational amplifier OP.

The ring oscillator 300 may receive the regulated bias voltage VDD_Loc from the regulator 200 and generate an oscillation signal based on the regulated bias voltage VDD_Loc. The ring oscillator 300 may be a complementary metal oxide semiconductor (CMOS) ring oscillator having a cascade of inverters 310 with odd number of stages (e.g., M=2N+1, where N is a natural number) in a ring shape and a frequency counter 320. The cascade of inverters 310 receives the regulated bias voltage VDD_Loc and outputs an inverted bias voltage Vout. The frequency counter 320 receives the inverted bias voltage Vout, and counts the inverted bias voltage Vout according to a reference clock Fref to generate the oscillation signal. In some embodiments, the oscillation signal from the ring oscillator 300 may be outputted to a digital unit (not shown) for subsequent processing.

With the right choice of the current source Ib in the bias generator 100, which is typically very small (e.g., few micro-amp), the bias voltage VR1 is approximately equal to the following equation (2):

$$VR1 \approx VTp + VTn \quad (2)$$

In the equation (2), VTp and VTn are the threshold voltages for the PMOS transistor MP1 and the NMOS transistor MN1, respectively.

The output voltage VDD_Loc of the regulator 200 follows VR1 as in the equation (2).

Combining the equations (1) and (2), the inverter delay of the ring oscillator 300 becomes:

$$Td(T) \propto \frac{CL}{u(T) \cdot Cox \cdot \frac{W}{L} \cdot (Vdd - Vt(T))} \sim \frac{k}{u(T) \cdot Vt(T)} \quad (3)$$

In the equation (3), CL is the load capacitance, Cox is the unit-area-capacitance of the MOS transistor, W/L is the width and length of the MOS transistor, k is a temperature-independent term, and Vdd is the supply voltage. The u(T) and Vt(T) are mobility and threshold voltage.

For simplification, it is assumed VTp=VTn=Vt. This assumption holds as long as the Vt temperature effect between the PMOS transistor MP1 and the NMOS transistor MN1 tracks each other, which is the case from simulations. In other words, Vdd in the equation (3) is replaced by VTp+VTn in the equation (2), and then (Vdd−Vt(T)) in the denominator is simplified to Vt(T).

Since both u(T) and Vt(T) show negative temperature coefficients, as shown in FIGS. 3A and 3B, they work together in the equation (3) to make the temperature sensitivities more pronounced.

As described above, the apparatus of FIG. 6 uses the CMOS ring oscillator as the temperature sensor, and the CTAT bias method. The CTAT bias method ensures a fairly liner relationship between temperature and frequency as can be seen from the equation (3).

Figure 7:
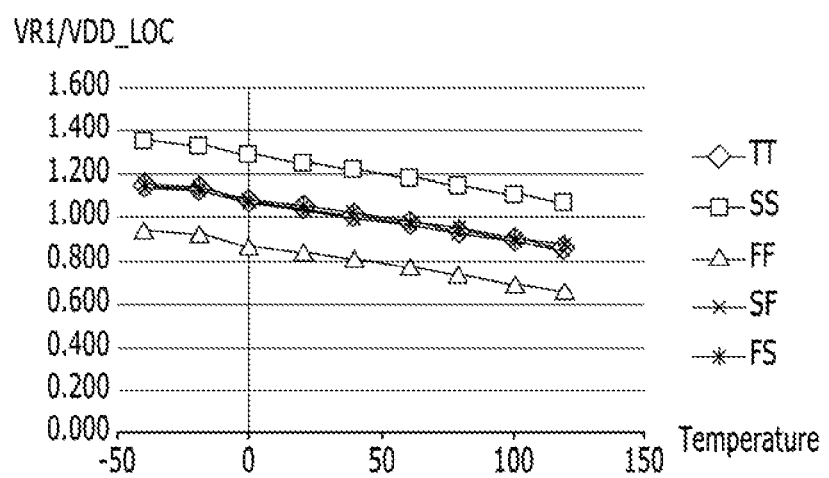
FIG. 7 illustrates bias voltages versus temperature in accordance with an embodiment.

FIG. 7 shows VR1/VDD_Loc voltage versus temperature. It has negative and linear temperature slope (CTAT), which enhances the CMOS ring oscillator temperature sensitivities, shown in FIG. 6.

Figure 8A:
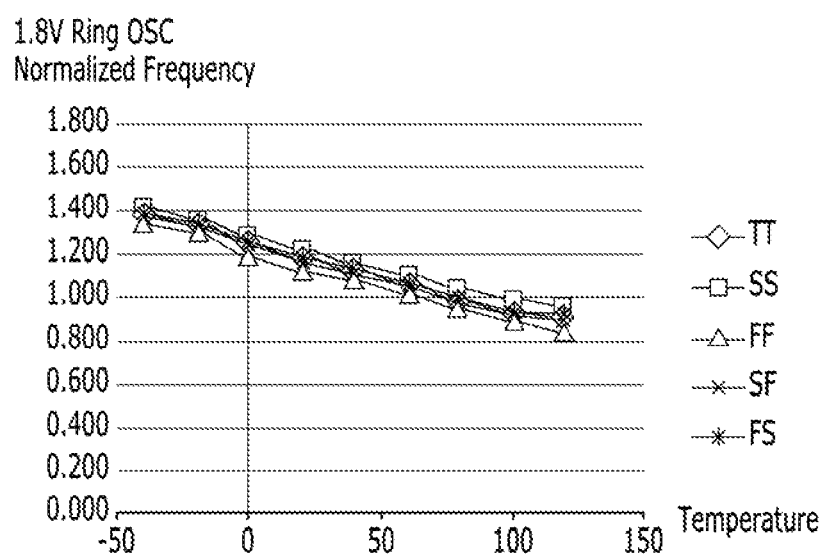
FIG. 8A illustrates an example of CMOS ring oscillator normalized frequency versus temperature in accordance with an embodiment.
Figure 8B:
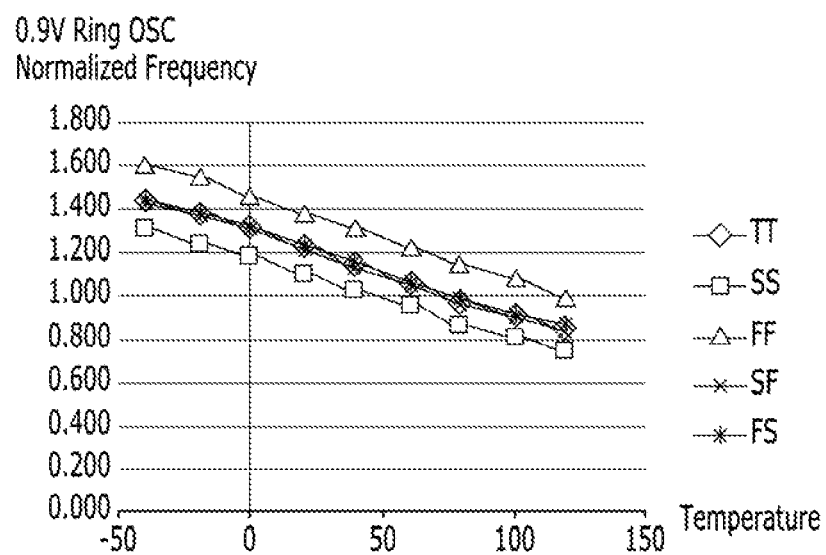
FIG. 8B illustrates another example of CMOS ring oscillator normalized frequency versus temperature in accordance with an embodiment.

FIGS. 8A and 8B show the simulated frequency versus temperature responses for 1.8V and 0.9V ring oscillators, using the embodiment shown in FIG. 6.

With one-point temperature calibration, all corner cases can be tightened to produce consistent temperature measures with a frequency counter 320 as shown in FIG. 6.

Figure 9A:
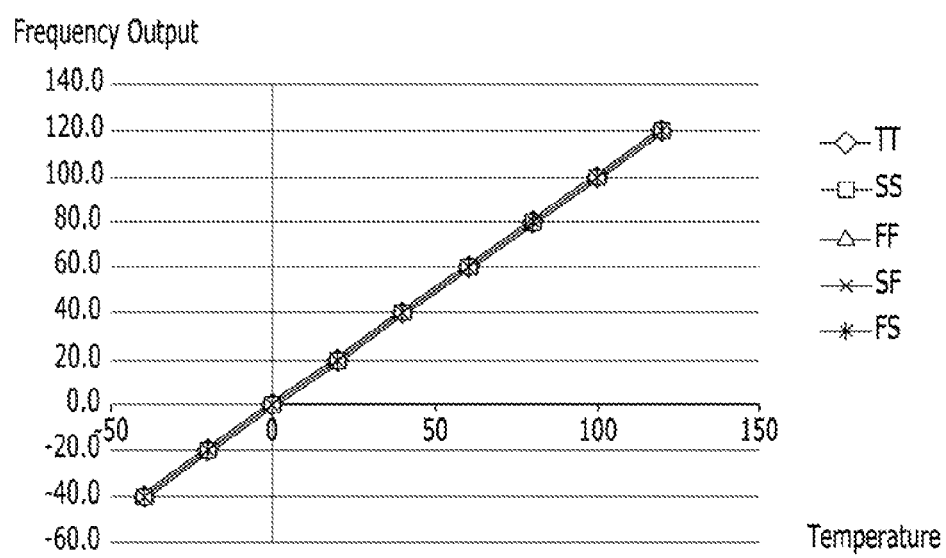
FIG. 9A illustrates an example of a single-point calibrated and transformed frequency output versus temperature in accordance with an embodiment.
Figure 9B:
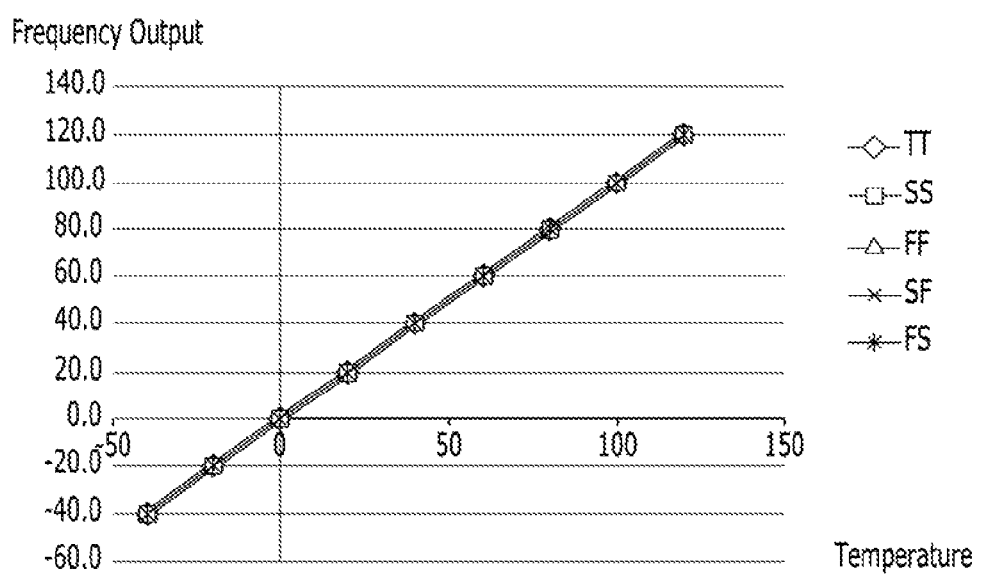
FIG. 9B illustrates another example of a single-point calibrated and transformed frequency output versus temperature in accordance with an embodiment.

With one-temperature calibration, typically performed during chip manufacturing, and with appropriated transformations, the frequency outputs in FIGS. 8A and 8B are shown in FIGS. 9A and 9B, respectively.

Temperature sensors implemented in the manner described above may be useful as storage systems move to 28 nm process and beyond. For example, as die size is reduced, such techniques permit the same functionalities and/or capabilities.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An apparatus comprising:
    a bias generator configured to generate a complementary-to-absolute-temperature (CTAT) bias voltage, the bias generator includes a current source driving a bias voltage, and a first transistor coupled with a second transistor in series between the bias voltage and a ground terminal;
    a regulator configured to regulate the bias voltage by using the CTAT bias voltage and outputting a regulated bias voltage; and
    a ring oscillator configured to receive the regulated bias voltage and generating an oscillation signal based on the regulated bias voltage.

2. The apparatus of claim 1, wherein the ring oscillator includes a complementary metal oxide semiconductor (CMOS) ring oscillator having:
    a cascade of inverters with odd number of stages in a ring shape, suitable for receiving the regulated bias voltage and outputting an inverted bias voltage; and a frequency counter suitable for receiving the inverted bias voltage, and counting the inverted bias voltage according to a reference clock to generate the oscillation signal.

3. The apparatus of claim 2, wherein the current source includes a first terminal coupled to a power supply voltage terminal and a second terminal driving the bias voltage.

4. The apparatus of claim 1, wherein the first transistor includes a NMOS transistor having a first terminal, a second terminal and a third terminal connected to the first terminal; and the second transistor includes a PMOS transistor having a first terminal connected to the second terminal of the NMOS transistor, a second terminal and a third terminal connected to the ground terminal.

5. The apparatus of claim 4, wherein the CTAT bias voltage VR1 is substantially equal to as follows:

$$VR1 \approx VTp + VTn$$

where VTp and VTn are the threshold voltages for the PMOS transistor MP1 and the NMOS transistor MN1, respectively.

6. The apparatus of claim 4, wherein the regulator includes:
an operational amplifier including a first input terminal for receiving the bias voltage, a second input terminal for outputting the regulated bias voltage, and an output terminal; and
a third transistor coupling between the output terminal of the operational amplifier and the second input terminal of the operational amplifier.

7. The apparatus of claim 6, wherein the third transistor includes a PMOS transistor having a first terminal connected to the power supply voltage terminal, a second terminal connected to the second input terminal of the operational amplifier, and a third terminal connected to the output terminal of the operational amplifier.

8. An apparatus comprising:
a bias generator configured to generate a temperature complementary voltage, the bias generator including:
a current source having a first terminal coupled to a power supply voltage terminal and a second terminal driving a bias voltage; and
a first transistor and a second transistor coupled in series between the second terminal of the current source and a ground terminal;
a regulator configured to regulate the bias voltage by using the temperature complementary voltage and outputting a regulated bias voltage; and
a ring oscillator configured to receive the regulated bias voltage and generating an oscillation signal based on the regulated bias voltage.

9. The apparatus of claim 8, wherein the first transistor includes a NMOS transistor having a first terminal, a second terminal and a third terminal connected to the first terminal; and the second transistor includes a PMOS transistor having a first terminal connected to the second terminal of the NMOS transistor, a second terminal and a third terminal connected to the ground terminal.

10. The apparatus of claim 9, wherein the temperature complementary bias voltage VR1 is substantially equal to as follows:

$$VR1 \approx VTp + VTn$$

where VTp and VTn are the threshold voltages for the PMOS transistor MP1 and the NMOS transistor MN1, respectively.

11. The apparatus of claim 10, wherein the ring oscillator includes a complementary metal oxide semiconductor (CMOS) ring oscillator having:
a cascade of inverters with odd number of stages in a ring shape, the regulated bias voltage and outputting an inverted bias voltage; and
a frequency counter the inverted bias voltage, and counting the inverted bias voltage according to a reference clock to generate the oscillation signal.

12. The apparatus of claim 11, wherein the regulator includes:
an operational amplifier including a first input terminal for receiving the bias voltage, a second input terminal for outputting the regulated bias voltage, and an output terminal; and
a third transistor coupling between the output terminal of the operational amplifier and the second input terminal of the operational amplifier.

13. The apparatus of claim 12, wherein the third transistor includes a PMOS transistor having a first terminal connected to the power supply voltage terminal, a second terminal connected to the second input terminal of the operational amplifier, and a third terminal connected to the output terminal of the operational amplifier.

14. An apparatus comprising:
a bias generator configured to generate a complementary-to-absolute-temperature (CTAT) bias voltage, the bias generator includes a current source driving a bias voltage, and a first transistor coupled with a second transistor in series between the bias voltage and a ground terminal;
a regulator configured to regulate the bias voltage by using the CTAT bias voltage and outputting a regulated bias voltage; and
a ring oscillator configured to receive the regulated bias voltage and generating an oscillation signal based on the regulated bias voltage, wherein the ring oscillator includes a complementary metal oxide semiconductor (CMOS) ring oscillator having:
a cascade of inverters with odd number of stages in a ring shape, configured to receive the regulated bias voltage and outputting an inverted bias voltage; and
a frequency counter configured to receive the inverted bias voltage, and counting the inverted bias voltage according to a reference clock to generate the oscillation signal.

15. The apparatus of claim 14, wherein the current source includes a first terminal coupled to a power supply voltage terminal and a second terminal driving the bias voltage.

16. The apparatus of claim 14, wherein the first transistor includes a NMOS transistor having a first terminal, a second terminal and a third terminal connected to the first terminal; and the second transistor includes a PMOS transistor having a first terminal connected to the second terminal of the NMOS transistor, a second terminal and a third terminal connected to the ground terminal.

17. The apparatus of claim 16, wherein the CTAT bias voltage VR1 is substantially equal to as follows:

$$VR1 \approx VTp + VTn$$

where VTp and VTn are the threshold voltages for the PMOS transistor MP1 and the NMOS transistor MN1, respectively.

* * * * *